United States Patent
Haji-Sheikh et al.

(10) Patent No.: US 7,662,650 B2
(45) Date of Patent: Feb. 16, 2010

(54) PROVIDING PHOTONIC CONTROL OVER WAFER BORNE SEMICONDUCTOR DEVICES

(75) Inventors: Michael J. Haji-Sheikh, Dekalb, IL (US); James R. Biard, Richardson, TX (US); James K. Guenter, Garland, TX (US); Bobby M. Hawkins, Wylie, TX (US)

(73) Assignee: Finisar Corporation, Sunnyvale, CA (US)

( * ) Notice: Subject to any disclaimer, the term of this patent is extended or adjusted under 35 U.S.C. 154(b) by 408 days.

(21) Appl. No.: 10/486,666

(22) PCT Filed: Aug. 12, 2002

(86) PCT No.: PCT/US02/25663

§ 371 (c)(1),
(2), (4) Date: Feb. 12, 2004

(87) PCT Pub. No.: WO03/017353

PCT Pub. Date: Feb. 27, 2003

(65) Prior Publication Data

US 2007/0117242 A1     May 24, 2007

Related U.S. Application Data

(60) Provisional application No. 60/311,916, filed on Aug. 13, 2001.

(51) Int. Cl.
*H01L 21/66*     (2006.01)
*H01L 21/00*     (2006.01)
*G01R 31/26*     (2006.01)

(52) U.S. Cl. .................. 438/17; 438/40; 257/E21.214; 257/E21.328; 257/E33.067

(58) Field of Classification Search .................. 438/32, 438/34, 39, 42, 40, 17; 257/93, E33.011, 257/E33.069, E21.328, E33.067, E21.214; 372/50.11, 50.12
See application file for complete search history.

(56) References Cited

U.S. PATENT DOCUMENTS 4,222,792 A * 9/1980 Lever et al. .................. 438/435

(Continued)

FOREIGN PATENT DOCUMENTS

CN     1045138     9/1999

(Continued)

OTHER PUBLICATIONS

"Full-Wafer Burn-In of Diode Lasers," IBM Technical Disclosure Bulletin, IBM Corp., New York, US, vol. 35, No. 4A, Sep. 1, 1992, p. 488.

(Continued)

*Primary Examiner*—David S Blum
(74) *Attorney, Agent, or Firm*—Workman Nydegger

(57) ABSTRACT

Disclosed are methods for providing wafer photonic flow control to a semiconductor wafer (1700) having a substrate (1720), at least one active layer (1765) and at least one surface layer (1710). Photonic flow control can be achieved through the formation of trenches (1725) and/or insulating implants (1730) formed in said wafer (1700), whereby active regions (1760) are defined by trenches (1725) that operate as nonconductive areas (1750). Methods of and systems for wafer level burn-in (WLBI) of semiconductor devices are also disclosed. Photonic flow control at the wafer level is important when using WLBI methods and systems.

19 Claims, 13 Drawing Sheets

U.S. PATENT DOCUMENTS

| | | | |
|---|---|---|---|
| 4,276,098 A | 6/1981 | Nelson et al. | |
| 4,860,079 A | 8/1989 | Turner | |
| 5,073,806 A * | 12/1991 | Idei | 257/96 |
| 5,428,298 A | 6/1995 | Ko | |
| 5,513,200 A | 4/1996 | Paoli | |
| 5,570,032 A | 10/1996 | Atkins et al. | |
| 5,719,891 A | 2/1998 | Jewell | |
| 5,729,563 A * | 3/1998 | Wang et al. | 372/50.23 |
| 5,929,651 A | 7/1999 | Leas et al. | |
| 6,184,053 B1 | 2/2001 | Eldridge et al. | |
| 6,204,074 B1 | 3/2001 | Fiore et al. | |
| 6,222,206 B1 | 4/2001 | Chirovsky et al. | |
| 6,229,329 B1 | 5/2001 | Nakata et al. | |
| 6,273,400 B1 | 8/2001 | Kuchta | |
| 6,340,302 B1 | 1/2002 | Ladd | |
| 6,351,134 B2 | 2/2002 | Leas et al. | |
| 6,407,563 B2 | 6/2002 | Ohtaki | |
| 6,549,026 B1 | 4/2003 | DiBattista et al. | |
| 6,771,086 B2 | 8/2004 | Lutz et al. | |
| 6,778,578 B2 * | 8/2004 | Lee et al. | 372/68 |
| 6,830,940 B1 * | 12/2004 | Wasserbauer et al. | 438/14 |
| 6,842,029 B2 | 1/2005 | Howland | |

FOREIGN PATENT DOCUMENTS

| | | |
|---|---|---|
| DE | 4223658 | 1/1993 |
| EP | 0841572 | 5/1998 |
| GB | 2347558 | 9/2000 |
| JP | 03-089528 | 4/1991 |
| JP | 04-262551 | 9/1992 |
| JP | 05029418 A | 2/1993 |
| JP | 08-037215 | 6/1996 |
| JP | 10-144750 | 5/1998 |
| JP | 10-178074 | 6/1998 |
| JP | 10178074 | 6/1998 |
| JP | 2000-065862 | 3/2000 |
| JP | 2000111576 | 4/2000 |
| JP | 2000-258495 | 9/2000 |
| JP | 2001050983 | 2/2001 |
| JP | 2001-159643 | 6/2001 |
| WO | 98/58266 | 12/1998 |

OTHER PUBLICATIONS

U.S. Appl. No. 10/486,661, filed Aug. 21, 2007, Non-Final Office Action.

U.S. Appl. No. 10/486,661, filed Jul. 9, 2008, Final Office Action.

U.S. Appl. No. 10/486,665, filed Sep. 21, 2007, Non-Final Office Action.

U.S. Appl. No. 10/486,665, filed May 28, 2008, Final Office Action.

* cited by examiner

PROVIDING PHOTONIC CONTROL OVER WAFER BORNE SEMICONDUCTOR DEVICES This invention claims priority to U.S. provisional patent application, Ser. No. 60/311,916, entitled "METHODS OF AND SYSTEMS FOR WAFER LEVEL BURN-IN OF ELECTRONIC DEVICES" filed Aug. 13, 2001.

TECHNICAL FIELD

This invention relates to semiconductor wafer-based devices. More particularly the present invention relates to providing photonic control over semiconductor devices borne on a semiconductor wafer. The present invention is also related to wafer level burn-in of semiconductors such as vertical cavity surface emitting lasers (VCSELs) using photonic control design.

BACKGROUND OF THE INVENTION

Solid-state semiconductor devices are found in most electronic components today. For example, semiconductor lasers are important devices in applications such as optoelectronic communication systems and high-speed printing systems. It is common for more than 60,000 semiconductor laser components to be fabricated on a single wafer.

There continues to be increased interest in vertical cavity surface emitting lasers (VCSELs). VCSELs are typically made by growing several layers of reflective material on a substrate material. VCSELs include a first mirrored stack, formed on the substrate by semiconductor manufacturing techniques, an active region, formed on top of the first mirrored stack, and a second mirrored stack, formed on top of the active region. By providing a first contact on top of the second mirrored stack, and a second contact on the backside of the substrate, a current is forced through the active region, thus driving the VCSEL. VCSELs can be fabricated/grown with combinations of gallium, arsenic, nitrogen, aluminum, antimony, phosphorous and/or indium placed within or about a typical GaAs substrate.

Historically, the manufacturing of semiconductors has been a very elaborate and expensive multi-step process. Component burn-in generally refers to the process of thermally and/or electrically testing newly fabricated semiconductor components. Burn-in allows for the individual identification of faulty components coming for a lot or batch. Currently, components are burned-in at the "package level", which means that the individually-packaged devices are typically tested after being derived from a wafer. Each component is tested and placed in sockets to be burned-in either as a packaged unit or to be tested as bare die (before packaging). Either die or package level burn-in can be costly for manufacturers because it is labor intensive. Each component has to be tested, requiring plenary human intervention.

Although wafer level burn-in (WLBI) methods and systems are currently being explored by the semiconductor industry, proposed systems and methods generally require that a plurality of electrical probes contact a plurality of electrical contacts on a wafer. Such systems can be complex and require extra care with regard to probe and contact alignment. For example, U.S. Pat. No. 6,339,329 issued to Nakata et al., entitled "Method of testing electrical characteristics of multiple semiconductor integrated circuits simultaneously", is typical of the technological direction being taken in the industry for WLBI. The Nakata et al. patent teaches simultaneous testing of a plurality of semiconductor integrated circuit elements by bringing a plurality of probe terminals into contact with a plurality of testing electrodes associated respectively with a plurality of semiconductor integrated circuit elements on a wafer and applying a voltage to each of the testing electrodes from the common voltage supply line via a plurality of positive temperature coefficient elements.

The semiconductor fabrication industry needs methods and systems for reducing the costs and associated labor currently required to carry out device burn-in. Further, the semiconductor industry needs WLBI methods and systems that can be used in the manufacturing and test of semiconductor components having front and back contacts, such as VCSELs, diodes, LEDs, and other semiconductor devices.

The present inventors have recognized that it would be advantageous to remedy current burn-in procedures by describing methods and systems of accomplishing WLBI of components. During WLBI operations, however, the present inventors have discovered that lack of current and/or photonic control between devices borne by a single wafer can be problematic, resulting in inaccurate burn-in and/or damaged devices. The present inventors have therefore invented systems and methods to control photonic flow between wafer borne electronic devices during wafer level burn-in processing. Accordingly, the present invention is described and presented as novel methods and means to address the shortcomings currently found with WLBI processes.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and the abstract as a whole. Additional objects and advantages of the current invention will become apparent to one of ordinary skill in the art upon reading the specification.

Wafer level burn-in (WLBI) methods and systems can reduce the need for package level burn-in and can reduce overall component production costs. The WLBI system described herein has two distinct electrodes for the application of electrical bias on each side of a wafer having back and front electrical contacts for a plurality of semiconductor devices born by the wafer. Cooling systems can also enable the application of an uniform temperature to a wafer undergoing burn-in. Yet current and/or photonic flow control throughout wafer-borne devices is generally needed and can generally only be provided directly at the component level.

The WLBI contacts apply bias to the full area of the electronic device wafer's device contacts and substrate surfaces. At times, current and/or photonic leakage can occur between neighboring devices on a wafer. The present invention describes a manner in which electronic devices borne on the same wafer can avoid shorting where photonic flow is channeled to the appropriate active regions of each device. Control of photons that flow outside of the intended region can be controlled through the implementation of several designs.

It is an object of the present invention to provide means of controlling photon flow between semiconductor devices borne on a semiconductor wafer. Such control is useful when undertaking methods of and systems for conducting WLBI of semiconductor devices.

In accordance with addressing the limitations of the prior art, presented are methods and systems for burning-in electronics components at the wafer level, or WLBI, using photonic control means.

It is another feature of the present invention to describe a method of achieving WLBI for semiconductor devices wherein a wafer containing semiconductor devices is fabricated, undergoes WLBI, individual devices are derived from the WLBI, and operational devices are made available for use (e.g., shipment or end-use).

It is another feature of the present invention to describe WLBI methods including consistent application of electrical power and thermal temperature to wafer-born devices during a WLBI procedure.

It is another feature of the present invention to describe WLBI methods including consistent application of thermal temperature to wafer-born devices during a WLBI procedure.

In accordance with aspects of the present invention, diffusion patterns on the electronic device wafer surface can create positive and negative polarity regions.

In accordance with aspects of the present invention, metallization patterns on the electronic device wafer surface can direct current flow.

In accordance with aspects of the present invention, implant patterns (e.g., sacrificial layers) on the electronic device wafer surface can create nonconductive regions.

In accordance with aspects of the present invention, trenches, etched, milled, or otherwise engraved into the surface of a wafer between devices represented by active layers can control photonic flow.

In accordance with aspects of the present invention, trenches filled with implants can minimize electrical or photonic flow outside of active regions associated with said devices.

In accordance with aspects of the present invention, oxidation patterns formed vertically and/or horizontally on a wafer can control photonic flow (These formations can include, but are not limited to, oxidation horizontally from vertical trenches).

In accordance with aspects of the present invention, optical barriers, is including but not limited to, trenches can be patterned into the electronic device wafer surface to prevent lateral photon propagation and photogenerated current flow in lateral regions outside of the intended region.

In accordance with aspects of the present invention, dielectric patterns can be formed on an electronic device wafer surface.

In accordance with aspects of the present invention, dielectric materials can also include, but are not limited to, nitride, oxide, polyamide, and photoresist.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

The present invention replaces component, or device level, burn-in with new methods and systems that achieve burn-in results at much lower cost. This disclosure of the present invention teaches how to burn-in many wafer-based components simultaneously while the components are integrally part of the wafer, rather than using current processes known in the art that generally require the handling of one die/component at a time. Prior methods are generally more labor intensive. Furthermore, the present invention substantially reduces scrap devices resulting from post wafer burn-in operation.

FIGS. 1-9 illustrate the manner in which WLBI is performed using a wafer level burn-in system. The remaining figures, FIGS. 10-17, illustrate current control at the wafer level while utilizing the novel wafer level WLBI methods and systems described herein in accordance with the present invention.

Figure 1:
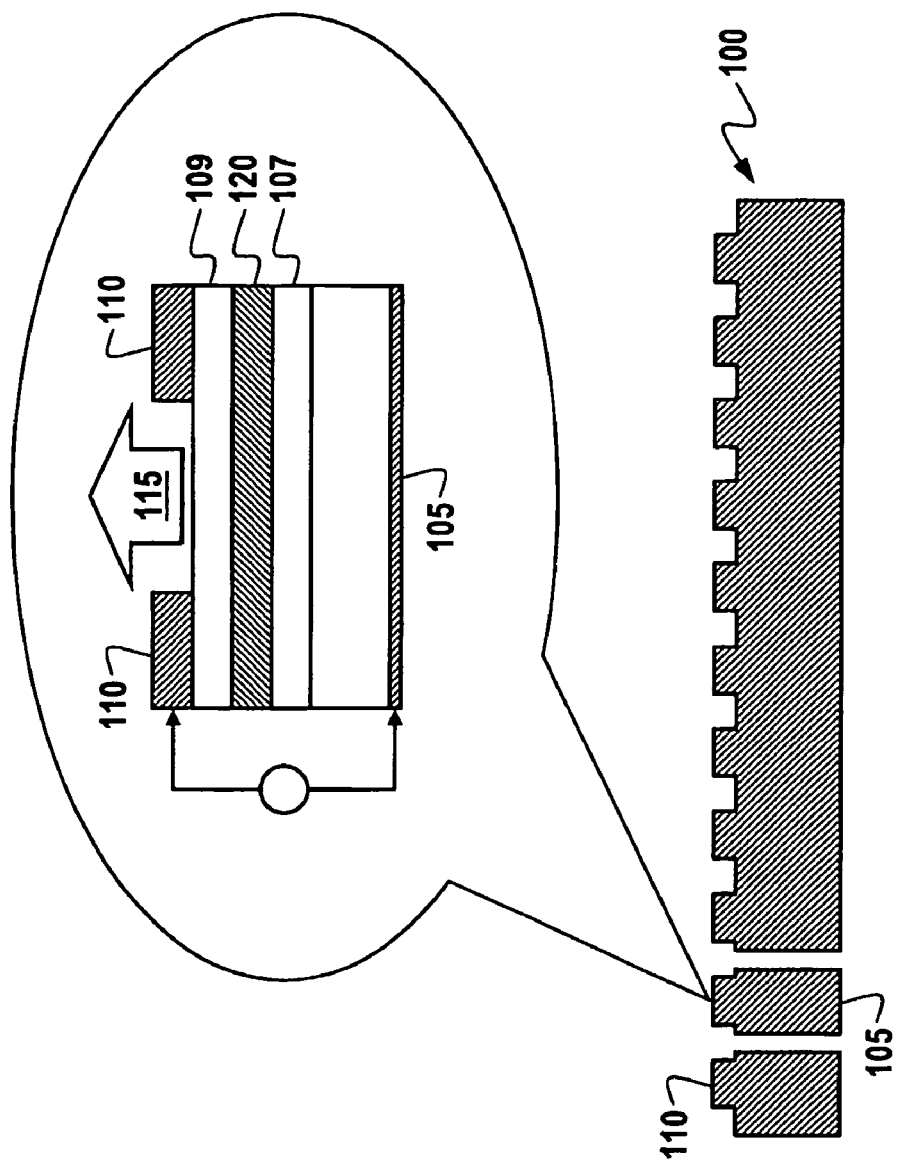
FIG. 1 is a blown-up illustration of a prior art semiconductor device having electrical contacts on the bottom and top layers, as well as a prior art illustration of a wafer containing a plurality of devices such as that shown in the blow-up illustration.

Referring to FIG. 1, an example of a prior art semiconductor device is shown as a blown-up illustration from its location on a wafer 100. The device illustrated in the blown-up portion generally exemplifies an active device, such as a VCSEL or LED. The active region 120 of the device, e.g., VCSEL, creates and amplifies light that is allowed to exit 115 through a window or opening on the surface of the device. Electrical potential is supplied to the device at a common contact 105 typically located on the bottom of the device and wafer and typically is used to apply negative electrical potential to the device. Common contact 105 can generally be associated with the substrate 107 of the wafer 100. A second contact 110, generally used to apply positive (+) potential to the device, is typically located as the uppermost layer 109 of the device. During device manufacturing, the device shown in the blow-up is cut from the wafer 100. Prior to the present invention, it has been normal practice to burn-in the individual wafer either before or after packaging. With the present invention all devices will now be able to undergo burn-in testing (thermal and electrical) without being separated from the wafer 100.

Figure 2:
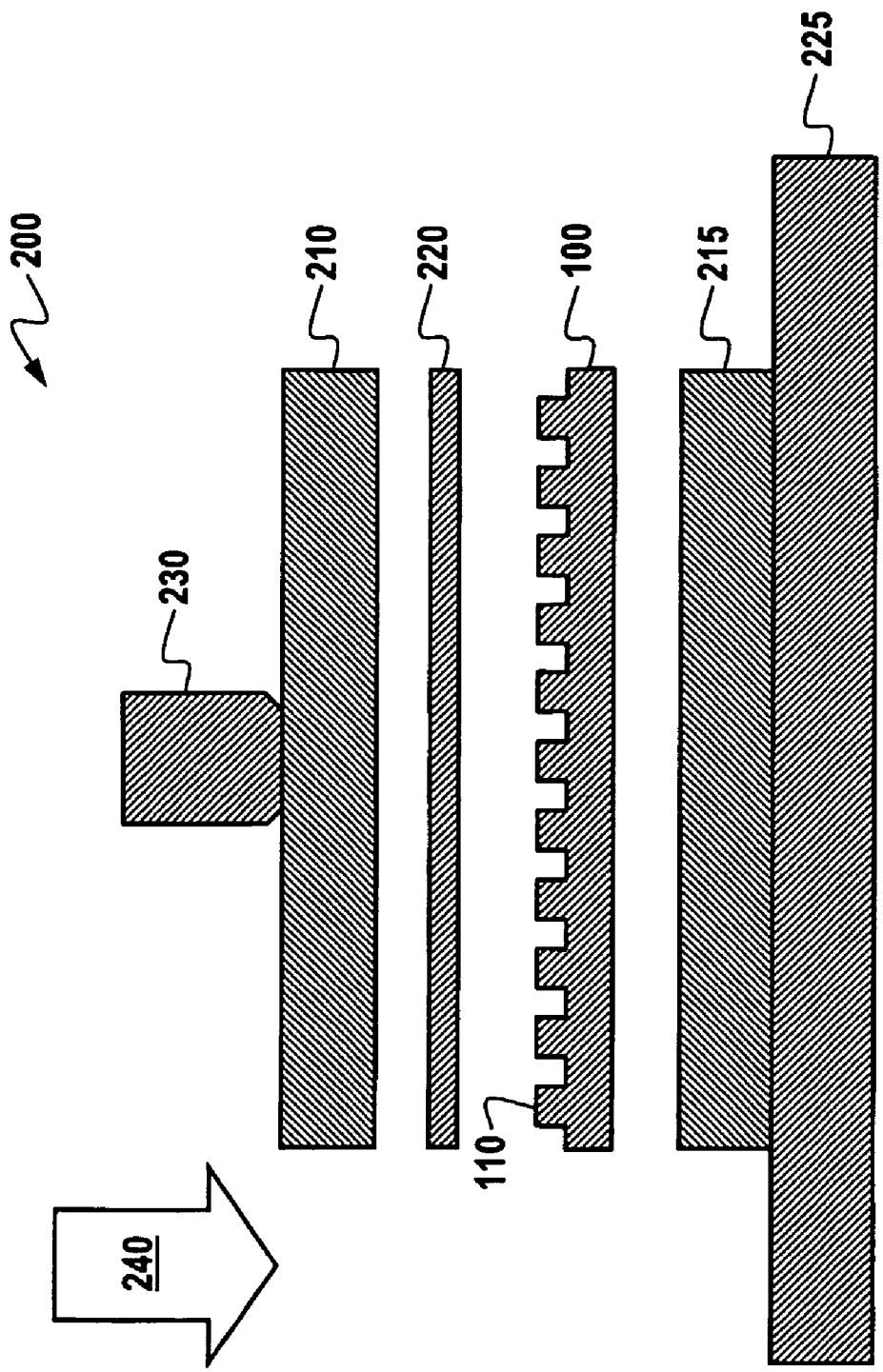
FIG. 2 is an illustration of one embodiment of the present invention wherein a system can supply electrical and thermal contact to/with a wafer, control physical application of pressure with a self-adjusting upper contact assembly, and regulate temperature with a heat exchanger.

Referring to FIG. 2, primary components used in an important embodiment of the present invention are shown. In a wafer level burn-in (WLBI) system 200, a wafer 100 is shown disposed between an upper contact plate 210 and lower contact plate 215. It should be appreciated that the system need only include two electrical contact plates, i.e., contact plates 210 and 215, although other electrical contacts can be used in accordance with the present invention. Further, it should be appreciated that a system could be devised to receive a semiconductor wafer vertically, in which case the upper contact plate 210 can be referred to as a first contact plate and the lower contact plate 215 can be referred to as a second contact plate. For purposes of the present detailed description, it will be assumed that WLBI systems will take advantage of gravity and, therefore, operate horizontally. Now, therefore, upper contact plate 210 and lower contact plate 215 are used to provide positive and negative electrical potential to the wafer 100. As previously shown in FIG. 1, common contact 105 (which can be the substrate of the wafer) provides electrical contact by lower contact plate 215. Upper contact plate 210 can provide electrical contact directly to each of the devices formed on the wafer 100 via their respective surface contacts 110.

It should be appreciated that variations on the upper surface (or device side) of the wafer 100 may develop during creation/processing of a wafer, or variations can also be formed on the surface of the upper contact plate 210, that may not allow for electrical potential to be applied to all devices on the wafer. In order to ensure that all devices are provided with electrical potential from the upper contact plate 210, a conductive and pliable layer 220 can be optionally introduced between the upper contact plate 210 and the wafer 100 via common contact 110. The pliable layer 220 can also reduce mechanical pressure on the device side of the wafer 100. Also, pliable layer 220 can be optionally introduced between the lower contact plate 215 and the wafer 100 via common contact 105, preventing excessive mechanical pressure on the wafer 100. The upper contact plate 210 can be controlled by a controller 230. The controller can allow the surface of upper contact plate 210 to be optimally oriented against the surface of the device contacts 1-10, or the pliable, conductive material 220 when used. The controller can provide for X-Y-Z orientation of the upper plate 210.

During the burn-in process, thermal energy 240 can be provided through the upper contact plate 210 directly to all device contacts 110 formed on the surface of the wafer 100. If an optional pliable layer 220 is used, thermal energy must also be sufficient to pass through it to the wafer 100. In order to maintain a constant burn-in temperature at the wafer during processing, a heat exchanger 225 can be used. The heat exchanger 225 can provide cooling action through the lower contact plate 215 to the wafer 100. The heat exchanger 225 may include heat sink material, liquid cooling, air cooling and other heat transfer methods known in the art to regulate a constant temperature at the wafer 100.

Figure 3:
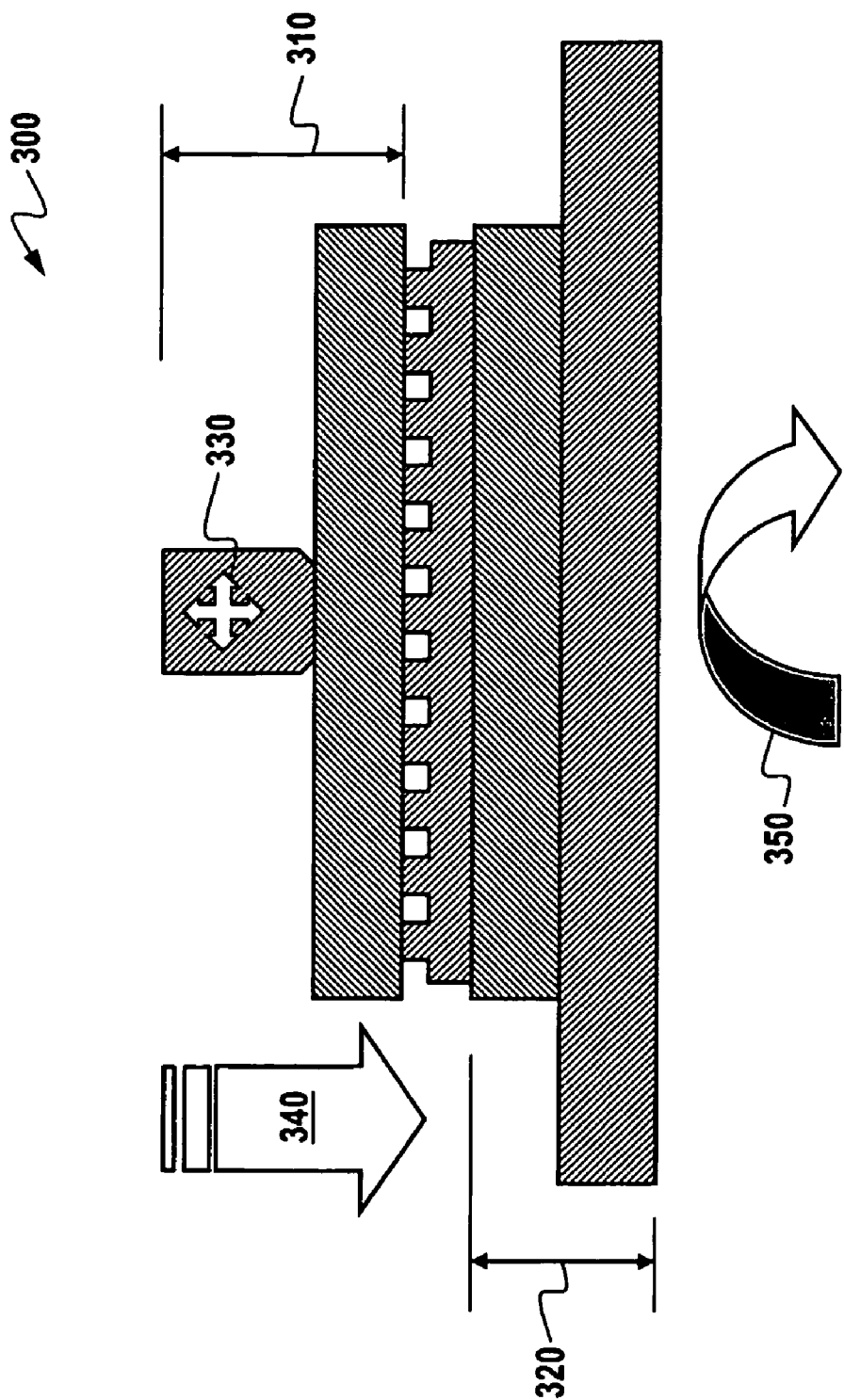
FIG. 3 is an illustration of another embodiment of the present invention wherein upper and lower contact assemblies are in contact with electrical contacts of a wafer; heat is shown flowing through the entire assembly, and heat is regulated around a set temperature by a heat exchanger.

Referring to FIG. 3, component placement of the system described in FIG. 2 is shown as it can be observed during operation. During burn-in testing, the upper contact portion 310 of the system is placed into contact with the upper surface (e.g., individual device contacts 110) of the wafer 100 or the pliable layer 220. In order to accomplish optimal placement of the upper contact portion 310 with the surface of the wafer 100, even when facilitated with the pliable layer 220, an upper adjustment mechanism 330 can allow the upper contact plate 210 to move, or "level", with respect to the wafer's surface. The pliable layer 220 can facilitate not only electrical contact with the device contacts on the wafer 100, but will also help in preventing mechanical pressure applied from the upper contact portion 310 that may damage the wafer or the individual devices on the wafer. Damage, such as fractures on the wafer or on the individual devices on the wafer, can be reduced or prevented because of the pliable nature of the pliable layer 220. Thermal regulation 350 can be accomplished through the lower contact portion 320 while thermal energy 340 is applied through the upper contact portion 310.

Figure 4:
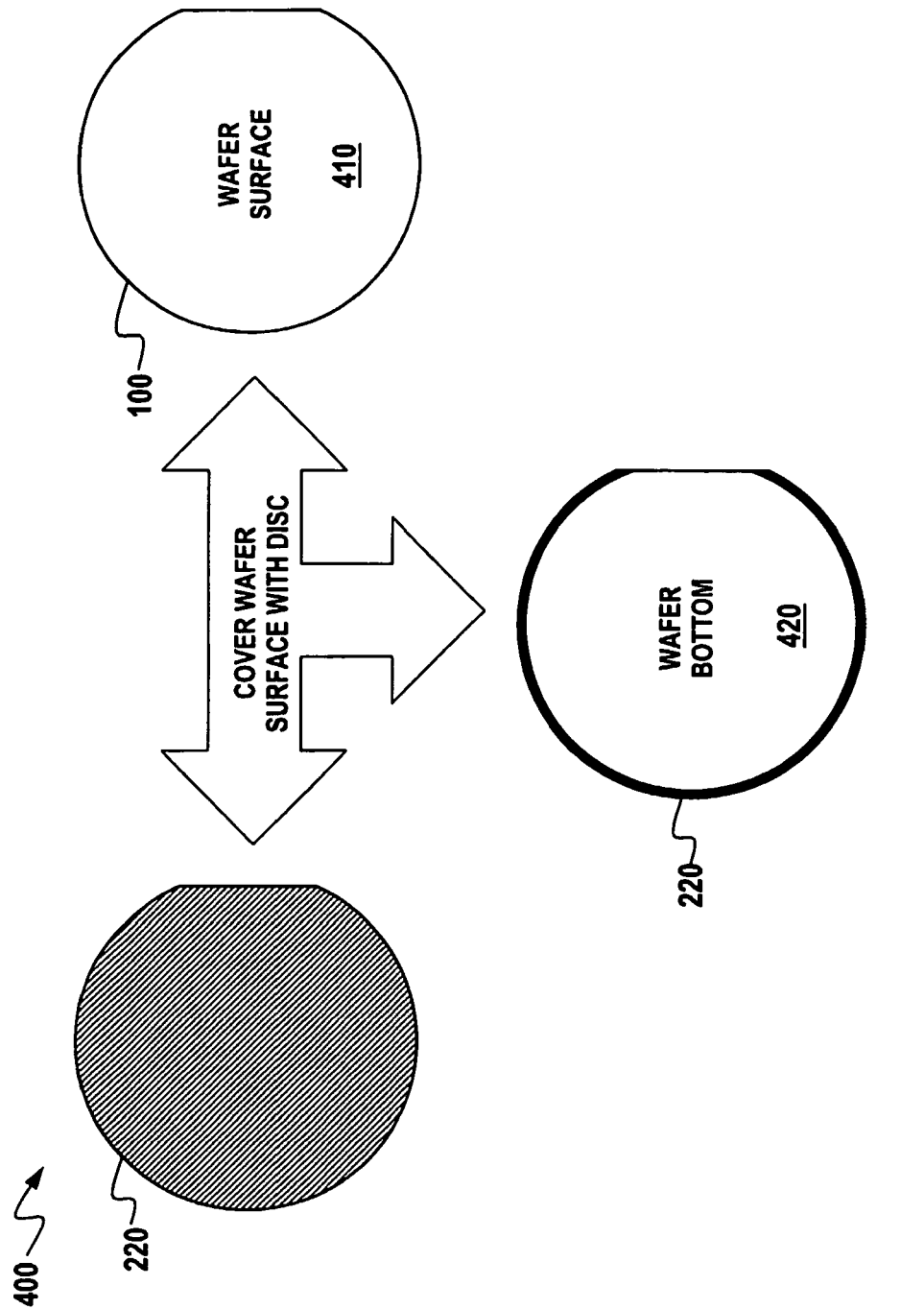
FIG. 4 is an illustration of a pliable wafer contacting material that is conductive, formed in a shape similar to a wafer such that it can be used to provide common electrical contact to semiconductors on the wafer, as well as the material covering the surface (device side) of the wafer (the bottom side of the wafer prominently showing)

Referring to FIG. 4, the pliable layer 220 and wafer 100 are shown. A wafer 100 undergoing burn-in procedures would be placed on top of the lower contact plate 215 shown in FIG. 2 with the wafer surface 410 facing upward toward the upper contact plate 210 of FIG. 2. The pliable layer 220 would then be placed on top of the wafer surface 410. The pliable layer 220 is preferably cut or formed so that it is generally shaped as a "disk" that is slightly larger than the outer perimeter of the wafer 100. A combination of pliable layer 220 and wafer bottom 420 is shown in FIG. 4, which illustrates the pliable layer 220 having a larger diameter than the diameter of the wafer 100.

When used, the pliable layer 220 should operate as an intermediate contact material that is electrically conductive, thermally conductive, and mechanically compressible. The pliable layer 220 should add sufficient electrical resistance to the burn-in circuit to minimize current flow variation die-to-die across the wafer 100. The pliable layer 220 must also be thermally conductive to transfer heat flow to/from the semiconductor wafer. The pliable layer 220 must be mechanically compressible to ensure uniform contact across non-uniform wafer and electrode surfaces and to prevent damage to the semiconductor wafer surfaces (upper and/or lower). Some materials that can be used include, but are not limited to, z-axis elastomers, conductive elastomers, conductive rubber, metal films, metal-impregnated polymer films, graphite discs, and sacrificial patterned metal. For example, a graphite foil disc referred to by Toyo Tanso USA of Troutdale, Oreg., the manufacturer and distributor, as PERMA FOIL can be cut from high purity graphite sheets. PERMA FOIL properties include:

Temperature Range: −200° C. to +3,300° C.
Compressibility (perpendicular to surface): 45%
Thermal Conductivity (parallel to surface): 120 Kcal/m. Hr° C.
Thermal Conductivity (perpendicular to surface): 4 Kcal/m. Hr° C.
Specific Electrical Resistance (parallel to surface): 900 μΩ-cm
Specific Electrical Resistance (perpendicular to surface): 250,000 μΩ-cm
Coefficient of Thermal Expansion (parallel to surface): $5 \times 10-61°$ C.
Coefficient of Thermal Expansion (perpendicular to surface): $2 \times 10-41°$ C.

Figure 5:
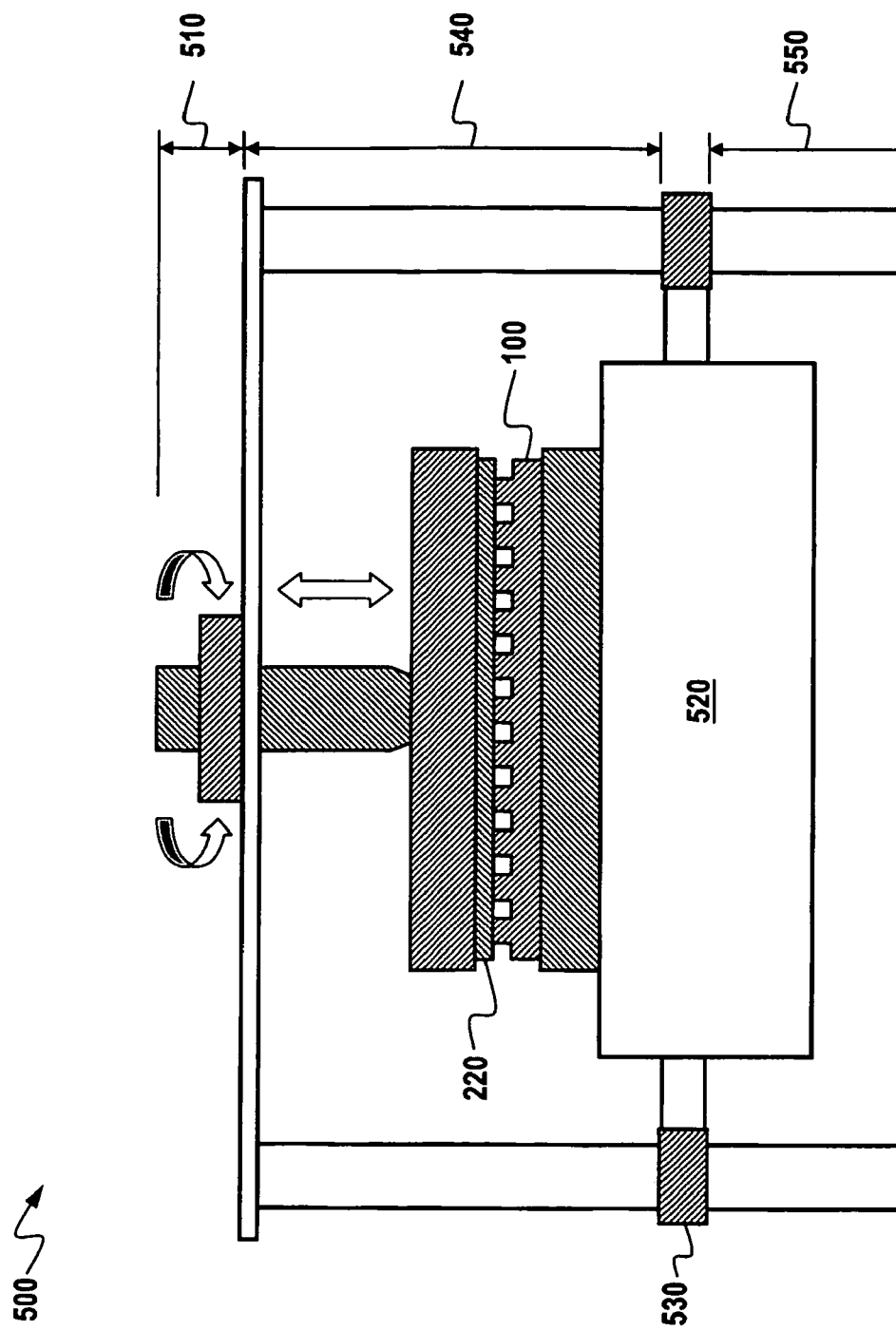
FIG. 5 is an illustration of another embodiment of the present invention wherein a frame structure is shown supporting wafer-contacting assemblies in a manner where electrical insulation/barrier means is provided between the respective positive (+) and negative (−) potential assemblies, as well as heat exchanger and a wafer undergoing thermal and electrical test (WLBI or wafer level burn-in)

Referring to FIG. 5, an illustration of a system 500 useful for wafer level burn-in in accordance with the present invention is shown. The wafer 100 and optional pliable layer 220 are shown in burn-in position. Control of the upper contact portion 310 shown in FIG. 3 can be achieved through, for example, a manual controller 510. For example, turning a mechanical adjustment mechanism clockwise or counterclockwise can cause the upper contact portion 310 to be lowered or raised, respectively. Electrical potential at the upper assembly 540 and lower assembly 550 of the system 500 can be achieved through electrical insulators 530 that can be placed between the assemblies 540 and 550. Of course, it should be appreciated by those skilled in the art that electrical insulation can be accomplished at other locations on the system 500. As shown in FIG. 5, the lower assembly 550 can include heat exchanger 520.

Figure 6:
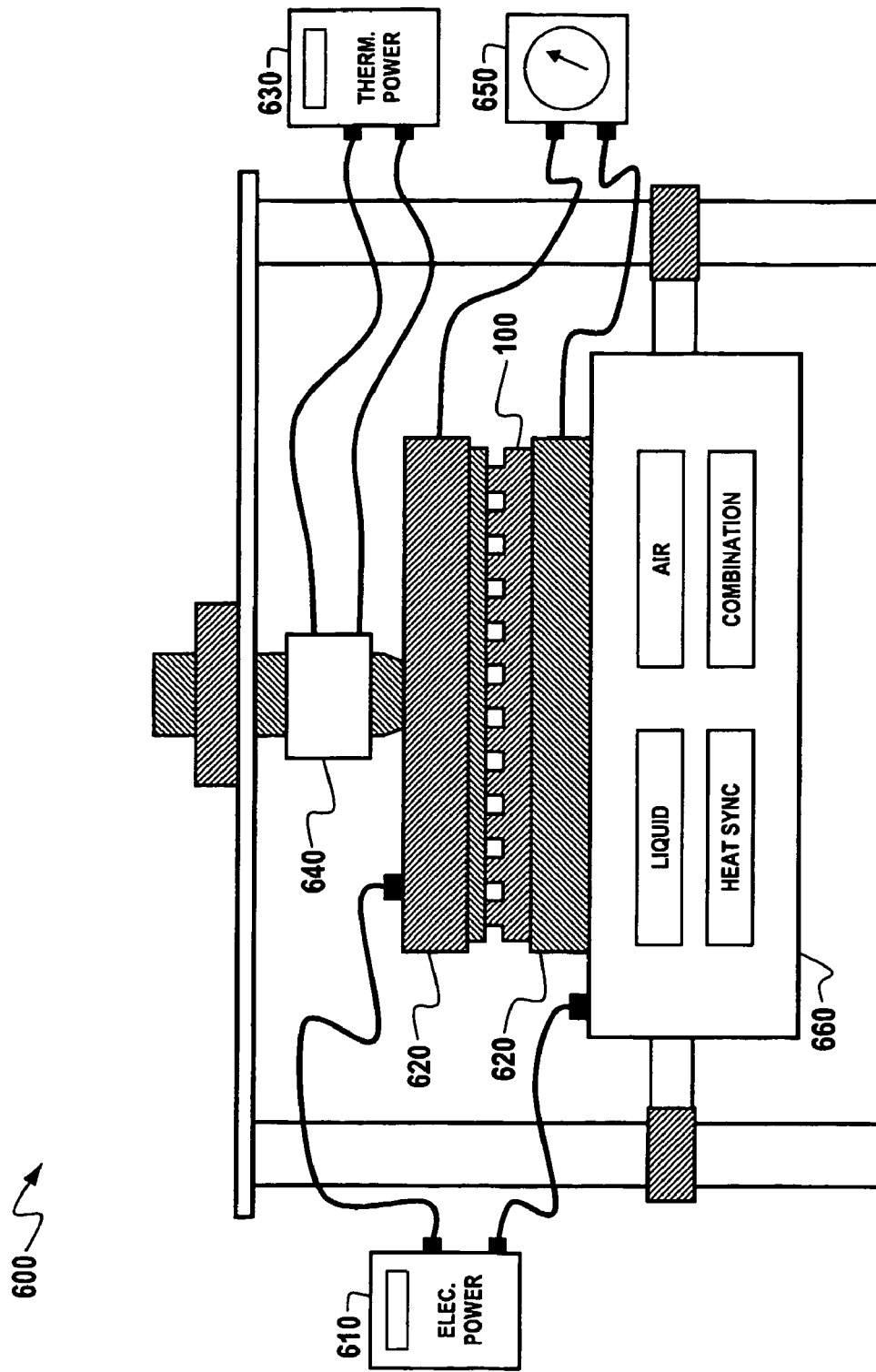
FIG. 6 illustrates another embodiment of the present invention wherein an electrical power source, thermal power source and thermocouple and temperature measuring equipment are in contact with the upper and lower assemblies of the system, as well as optional means of providing temperature control through the heat exchanger.

Referring to FIG. 6, an illustration of a WLBI system 600 in accordance with the present invention is shown with cooperating components to provide electrical power, thermal power, measurements and control features during wafer level burn-in processing. Electrical power can be provided to the upper 615 and lower 620 contact assemblies by an electrical power generator 610. Thermal power can be provided to the upper contact assembly by a thermal coupling 640 that can be placed into contact just above the upper contact plate 615 as shown in FIG. 6. Temperature can be monitored by thermocouple 650. Thermocouple 650 can cooperate with thermal power generator 630 and heat exchanger 660 in order to maintain a constant temperature on the wafer through the cooperation of the thermal coupling 640 and heat exchanger 660. Electrical power can be maintained by an electrical power generator 610 or other electrical equipment known in the art. As shown in FIG. 6, heat exchanger 660 can provide thermal control through liquid, air, heat sink material, or any combination of heat controlling means and equivalents thereof.

Figure 7:
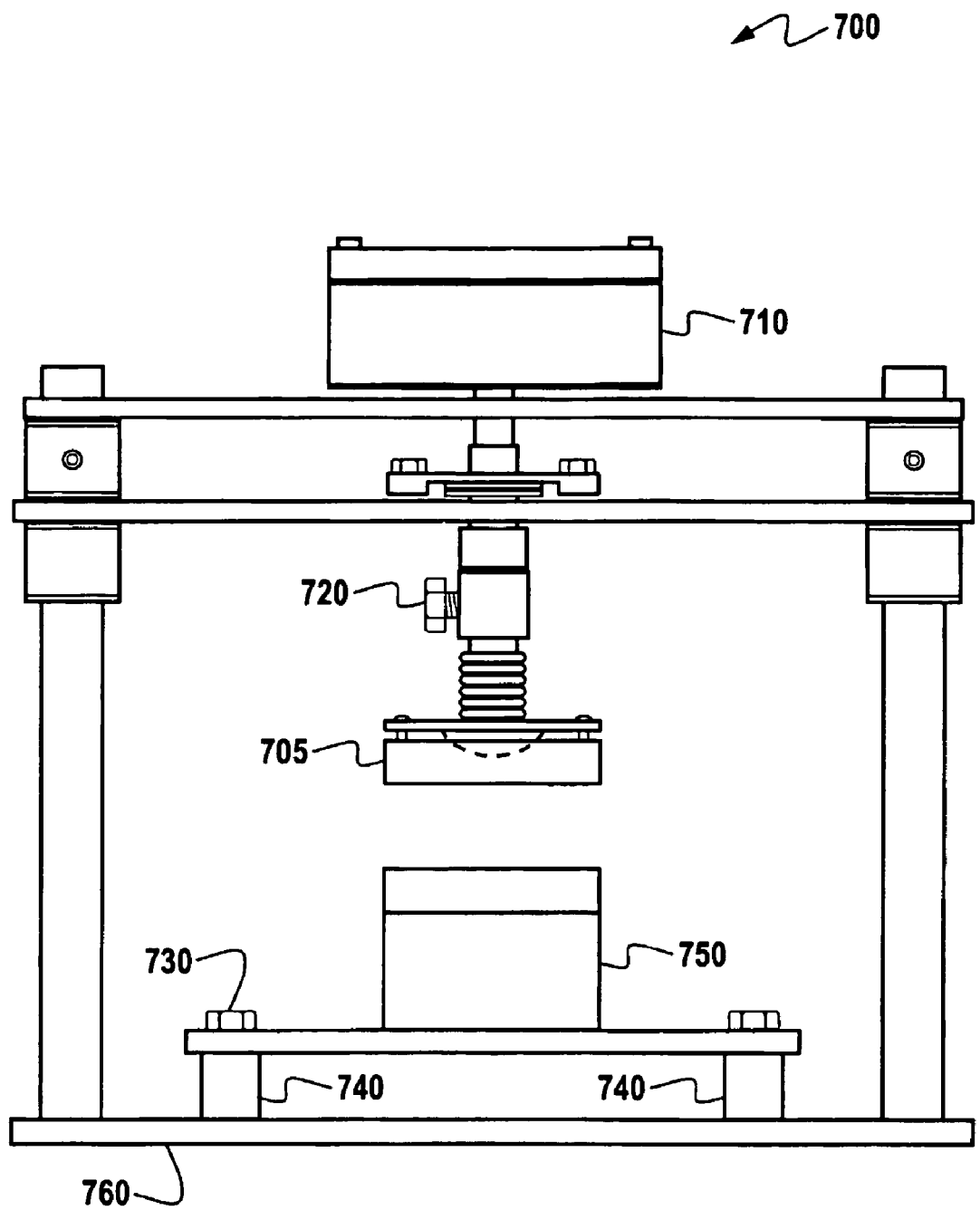
FIG. 7 illustrates another embodiment of the present invention wherein a mechanism for lowering and raising the upper contact plate is shown where the mechanism can be hydraulic, air cylinder, pneumatic, or otherwise controlled.

Referring to FIG. 7, illustrated is another embodiment of the present invention wherein a WLBI system 700 includes a mechanism 710 for lowering and raising the upper contact plate 705. The mechanism 710 can be hydraulic, air cylinder, pneumatic, or otherwise controlled. Also shown in FIG. 7 are electrical contact points 720 and 730 whereon electrical cabling from an electrical generator can be fastened. Another optional location for electrical insulators 740 is shown located beneath the heat exchanger 750 near the base 760 of the system 700.

Figure 8:
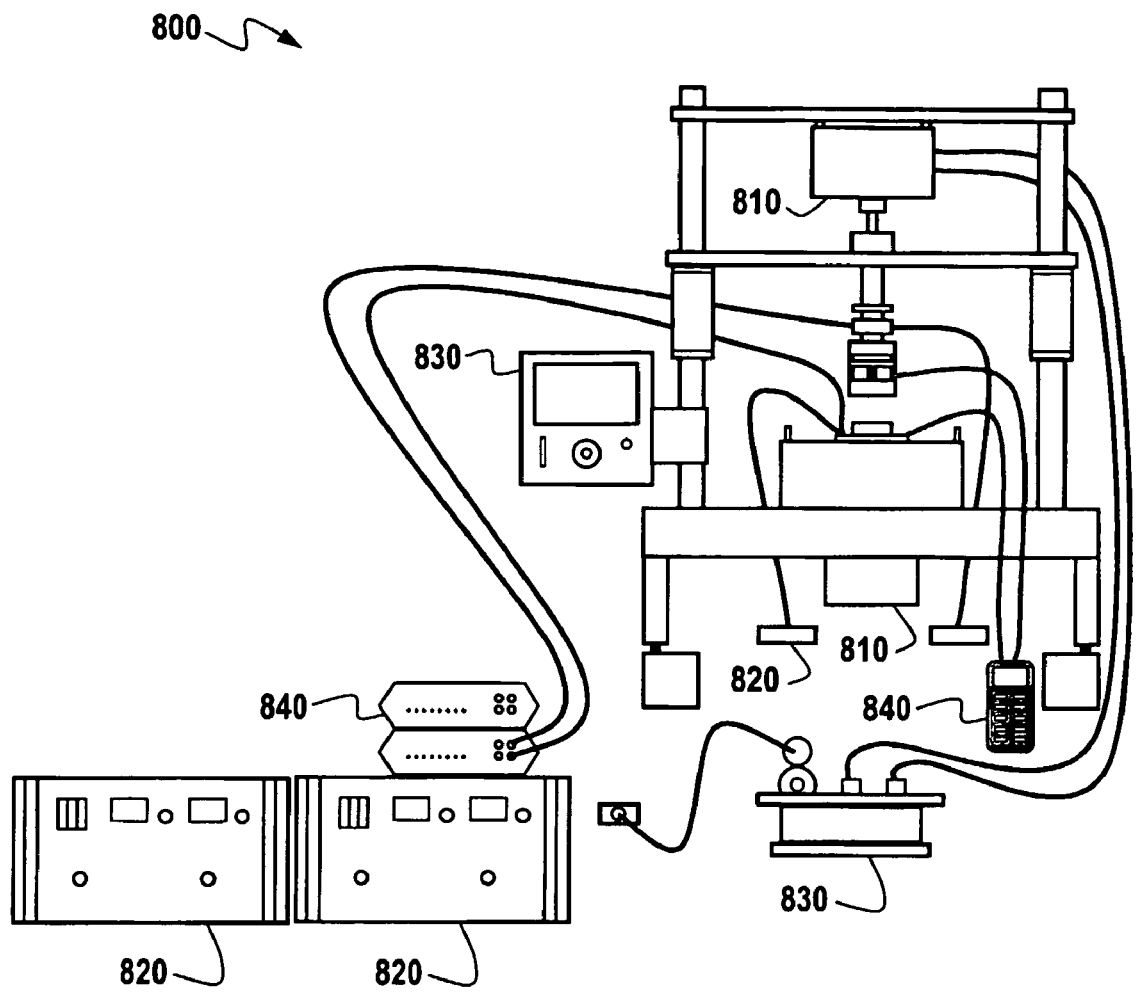
FIG. 8 illustrates mechanical, electrical and measurement components used for the WLBI system in accordance with the present invention.

FIG. 8 illustrates mechanical 810, electrical 820, control 830 and measurement 840 components useful for a WLBI system 800 in accordance with the present invention. The system 800 has been successfully tested in the burn-in of VCSEL wafers.

A method for carrying out WLBI in accordance with the present invention will now be described. It should be understood that variations in steps, time periods, electrical/thermal quantities and other parameters are possible given different semiconductor wafers. Use of a VCSEL in the following example, or exact methods, steps, time periods and electrical/thermal quantities, should not be construed as a limitation to method and systems of the present invention.

Figure 9:
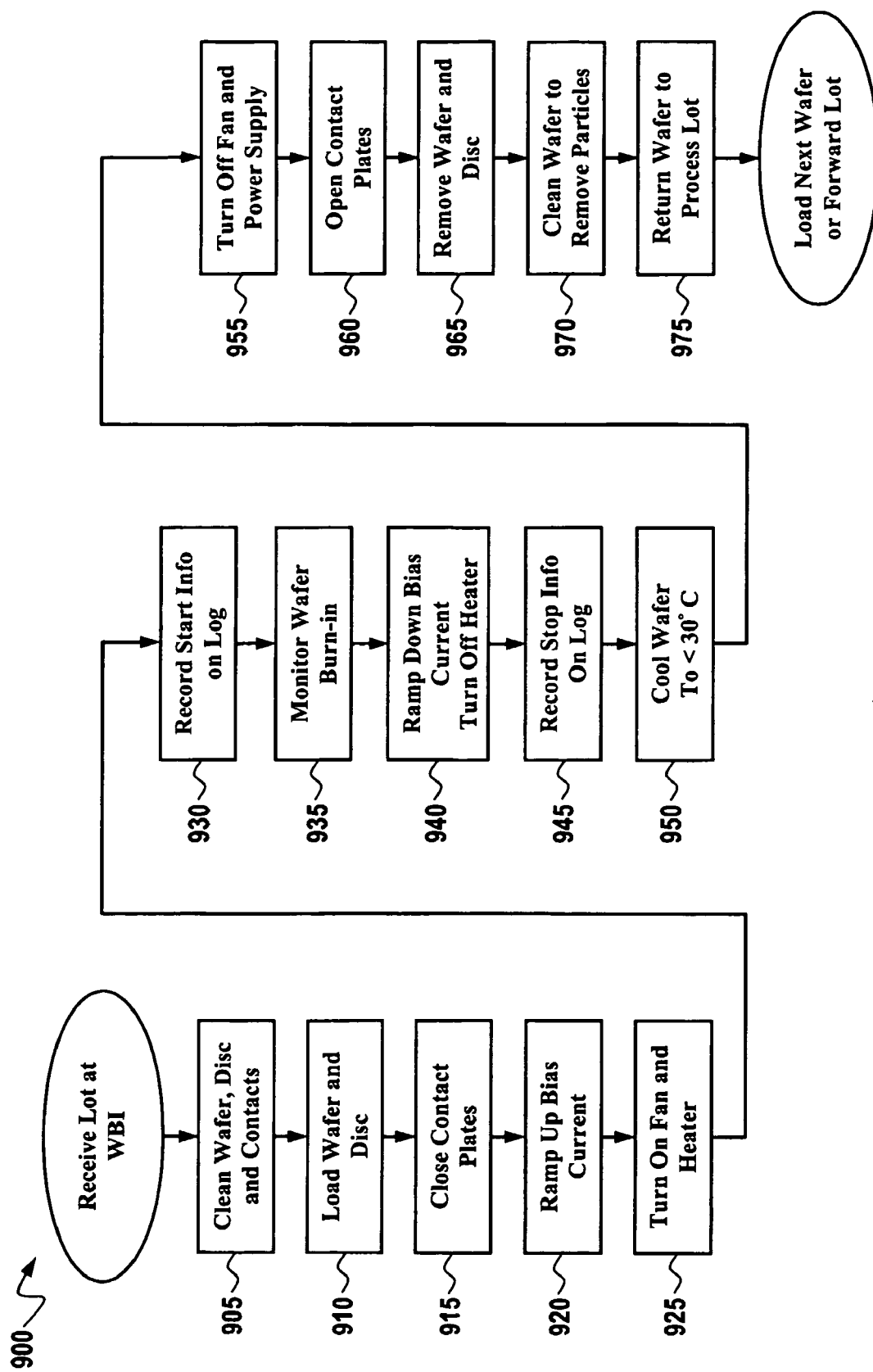
FIG. 9 illustrates a flow diagram of method steps for accomplishing WLBI in accordance with the present invention.

Referring to FIG. 9, a flow diagram is shown illustrating the wafer level burn-in process for a received lot of wafers in accordance with the present invention. Prior to burn-in processing, the wafer, graphite disc, and contact plates should be cleaned at step 905. The wafer number that is typically inscribed on outer top surface edge of the wafer should be checked and recorded prior to loading the VCSEL wafer and graphite disc (pliable layer 220) onto bottom contact plate at step 910. The bottom surface of the wafer should be placed on the lower contact plate so that it faces/contacts the bottom contact plate and the pliable layer 220, if used, can then be placed on the top (device-side) surface of the wafer. The contact plates are then carefully closed at low contact force (to prevent wafer damage) at step 915. The power supply bias current that is electrically in contact with the contact plates is then set to a selected burn-in setting and bias current is ramped up to operational level at step 920. The heat exchanger, for example, a cooling fan, and the thermal source, such as a heater, are then turned on at step 925 to their appropriate burn-in settings.

Once the burn-in process is initiated, a record of burn-in start information and settings may be recorded at step 930 on a burn-in log/form.

The wafer burn-in current and temperatures are monitored at step 935 during the burn-in process for each wafer, which may take several hours or days depending on the devices or application.

After the burn-in process time period is completed, the bias current being supplied to the wafer is ramped down and eventually turned off at step 940, and the heater is turned off at step 940. A record of the burn-in stop time and other observable information may be recorded at step 945 on the information log. The wafer is generally allowed to cool down at step 950 to less than 30° C. After the cool-down period, the heat exchanger (cooling apparatus which may include a fan powered by a power supply) is turned off at step 955 (and any other equipment should be turned off for safety and electrostatic discharge reasons). The contact plates are then opened at step 960. The wafer and pliable disc material are then removed at step 965. is The wafer is then cleaned at step 970 to remove graphite (or other pliable layer 220) particles, and the wafer is returned to the process lot at step 975. Another VCSEL wafer can then be loaded into the system from the lot or, if the lot is completed, the lot can be forward to the next operation (e.g., verification testing or device assembly).

The following description will now focus on VCSEL wafer burn-in considerations, but the principles can apply to other semiconductor wafers. An exemplary VCSEL wafer product is generally a 3-inch diameter round (with 2.9 inch diameter flat) gallium arsenide (GaAs) semiconductor wafer, typically 0.008-0.014 inches thick. The wafer has been processed with metallization patterns on the top side and full surface metallization on the bottom side. The wafer level burn-in process is a powered burn-in, supplying 20 mA dc typically, with 5-20 mA dc for some products, current limited, with approximately 2 volts to each device on the wafer, at 125° C. typically, with 85-150° C. for some products, controlled +/−5C., for 20 hours typically in an air ambient atmosphere. Each wafer (depending on device type) will have 24K-58K devices, for a total burn-in power supply current requirement of 120-1,200 Amps, with supply voltage capable of ranging 0-5 volts.

Typical VCSEL wafer power dissipation will range from 200 watts to 2,000 watts, depending on device count/wafer and bias current/device. The burn-in system of the present invention provides metal electrodes, which clamp at controlled pressure (adjustable 10-100 psi force, controllable to +/−5 psi) to the two sides of the wafer, opening up for loading/unloading. A graphite foil (i.e., pliable layer 220) nearly matching the shape of the VCSEL wafer surface, and currently known to be about 0.015 inches thick, can be inserted on the patterned topside of the VCSEL wafer to provide a cushioning layer that is electrically and thermally conductive. Significant heat will be generated by the combination of the graphite foil and the wafer during burn-in, which must be thermally managed by the burn-in system to maintain the targeted wafer bottom side temperature. Air and/or liquid cooling are useful to manage the thermal load.

The present inventors have developed a wafer level burn-in system which is air cooled and maintains 125° C. wafer temperature for up to 1,200 watts, with control for up to 1,400 watts at 140° C. wafer temperature. The target performance for maximum power dissipation is to maintain a 125° C. wafer temperature at 1,600 watts power dissipation. The WLBI system utilizes an air cylinder clamp to apply up to 700 pounds of force on the wafer. A thermocouple provides wafer substrate temperature to a control box, which turns the cooling fan on/off to maintain the target temperature +/−5° C. in the center of the bottom contact plate. The temperature profile across the bottom copper plate drops approximately 10° C. at edge from center reading. The heat path is generally downward through the bottom copper contact plate into a large copper heat sink with cooling fins through which air is forced. A propeller fan with 600 cfm capacity is utilized. An auxiliary heater is connected to the top contact plate to inject heat for low current wafer products.

The system used to accomplish VCSEL wafer burn-in should uniformly apply a pressure contact to the wafer that is adjustable to a target of 10-100 psi on 3 inch diameter wafer. This corresponds to 70-700 total pounds clamp force on 3 inch diameter wafer. The pressure should be controlled to +/−5 psi. An adjustable 120-1,200 Amps of dc current at 0-5 volt range during 20 hour burn-in is applied to the wafer and the devices formed on the wafer. Control of the voltage should be to within +/−1%.

Up to 2,000 watts of heat should be dissipated to control wafer temperature to a target in 85-150° C. range to +/−5° C. temperature tolerance over, for example, a 3 inch diameter wafer during the 20 hour burn-in. The contact pressure, bias current/voltage, and wafer temperature heating/ cooling should be ramped up/down during burn-in startup/completion in a controlled and adjustable manner. Contact pressure, bias current, bias voltage across wafer contact plates, and wafer (bottom contact plate) temperature during burn-in and the ramp-up and ramp-down should be monitored and data logged.

Material types selected for the machine parts of the WLBI system can include aluminum and copper as well as other material types. Support machined parts are preferably aluminum and all high-current path material is preferably copper with gold/nickel plated contacts to block copper migration into the gallium arsenide VCSEL wafer and to prevent copper oxidation and parasitic resistance/heat generation.

The top/bottom contact plates (210 and 215) should preferably self level to approximately 0.003 inches. The graphite disk (pliable layer 220) can compress to about 0.003 inches to compensate for some wafer/plate parallelism variations. The system should be able to operate continuously during a 20 hour burn-in for VCSELs. The system's use can be assumed to be over a six-day per week operation with four hours load/unload time.

VCSEL wafers should preferably be burned-in with controlled pressure contact, controlled bias current, and controlled temperature, for a controlled time period, without wafer breakage. Ramp-up and ramp-down processes should be controllable. The contact plate areas should preferably be flat, smooth, and clean to prevent irregular surfaces that can cause wafer breakage. A PC-based logging system with sensor instruments can be used to automate monitoring and to supply periodic readings. A PC-based system can monitor contact pressure, bias current, contact plate bias voltage, bottom contact plate temperature, top contact plate temperature, and log data each minute during ramp-up and ramp-down, then every 5 minutes during the 20 hour burn-in period. A data log for each system/wafer burn-in lot can be supplied in a data file that can be uploaded to a network server location.

For monitoring, a power supply can be calibrated and can supply signal on bias current. A voltmeter can measure contact plate bias voltage. Thermocouples can be inserted into upper/lower contact plates to measure temperature.

An over-temperature alarm should trigger shutdown of the bias power supply, which will remove the heat generation source. If loss of system air pressure should occur, the wafer contact force will be lost, which should trigger a system alarm. An uninterruptible power supply (UPS) should be used to support auxiliary 110 VAC control electronics to protect the system in case of loss of 110 VAC power. If loss of three-phase power should occur, a system alarm should trigger so that remedial measures can be taken to save the wafer and system.

Software used within a PC-controlled and automated data logging system can control and monitor several WLBI systems simultaneously; preferably, data log file output that can be uploaded to a network server location and viewed with Microsoft® compatible software (e.g., Excel, etc). A network interface such as Ethernet can provide the necessary network linkage and instrumentation control remotely.

Each WLBI system should preferably use three-phase 208 V AC 20 Amps for the power supply and single phase 110 VAC 20 Amps for control box electronics.

It should be commonly known that semiconductor wafers must be handled with electro-static discharge (ESD) considerations in mind. Appropriate cleanliness and non-static equipment, procedures and material should be used at all times when handling semiconductor wafers and devices. The system should provide electrostatic discharge (ESD) protection connections for operators during wafer handling. Wafer contact plates will be connected electrically to power supply terminals to prevent ESD.

The present burn-in process has already been shown in tests to "stabilize" VCSEL performance by operating a wafer-based device at elevated temperature and dc current for a fixed time. Component burn-in has been successfully tested at a temperature of 125° C., current of 20 mA, and a duration of 20 hours. The wafer-based test components were verified to be "stabilized" after individual components were built after being removed from the burned-in wafer, and changes in optical power output for each device was tracked during a 14 hour "operational" burn-in.

During testing, the WLBI system was required to work with "die shrink" wafers which would have 50K die/wafer, drawing 1,000 Amps/wafer at 20 mA/die, at 1.6V forward voltage drop for 1,600 watts total power dissipation. This wafer VF×IF power dissipation was to be the heat generator to drive the wafer to 125° C. The system then had to remove the heat in a controlled manner to maintain 125° C. The present invention has been shown to be operational at a full 1,000 Amps capability, with up to 2,100 watts dissipation capability. Testing of WLBI on full wafers to verify proper delta PO (optical power output) stabilization determined several interesting effects. Proton and oxide VCSELs behaved differently, leading to increased understanding of the manner in which the current flowed through the wafers. WLBI was demonstrated to roughly approximate the stabilization achieved by the component burn-in process. With the teaching of the present invention, WLBI is achievable for an 870 Amp array VCSEL product and can be adapted for use with other semiconductor products (e.g., LEDs) having electrical contact points at front, back or other surfaces of the wafer.

Several heat exchanger designs can be utilized to provide for thermal management of wafers being burned-in with the present invention. These diverse thermal management options will now be discussed.

The present inventors discovered that control of the current flow in wafer level burn-in when contacting the entire surface of the wafer, as illustrated with the two plate approach described, for example, in FIG. 2, required some device design considerations that are not required the conventional component burn-in of individual die with, for example, wire-bonded top contact.

As shown in FIGS. 3, 5 and 6, the WLBI contact systems and methods described herein apply bias to the full surface area of the surface of the electronic device wafer 100, both to the back and front, device-side contacts/contact surfaces located on the device-side of the wafer. It would be helpful given the present invention if electronic device wafer 100 could help channel the bias current to the appropriate active regions 120 of each respective device located on the wafer 100 during wafer level burn in.

The present invention a manner in which parasitic currents that flow outside of the intended region can be controlled by any of the following or variations or combinations thereof:

Diffusion patterns formed on the electronic device wafer surface that creates positive and negative polarity regions.

Metallization patterns formed on the electronic device wafer surface.

Implant patterns formed on the electronic device wafer surface that create nonconductive regions.

Sacrificial layers, such as photoresist, formed on the electronic device wafer surface creating nonconductive regions and which can be removed subsequent to burn-in processing.

Dielectric patterns formed on the electronic device wafer surface.

Dielectric materials could include, but are not limited to, nitride, oxide, polyimide, and photoresist.

Trenches that are etched, milled, or otherwise engraved into the surface to control current flow.

Trenches filled with implants for minimizing electrical or photonic flow outside of active regions.

Oxidation patterns formed vertically and/or horizontally that control current flow. These include, but are not limited to, oxidation horizontally from vertical trenches such as described in U.S. Pat. No. 5,903,588, Laser with a Selectively Changed Current Confining Layer, which is incorporated by reference.

Optical barriers, including but not limited to, trenches that are patterned into the electronic device wafer surface to prevent lateral photon propagation and photogenerated current flow in lateral regions outside the intended region.

An objective of parasitic current control over semiconductor devices borne on a single wafer is to force the bias current (typically 5-20 mA per device) through the active junction region, duplicating the component burn-in case. The term "parasitic current control" should be interpreted herein as it addresses the current flow that occurs outside of the active junction region. The inventors have determined that the combination of vertical trenches and surface dielectric patterns block the lateral, photogenerated current flow. The following description describes methods and apparatus that can control parasitic current flow in a wide variety of semiconductor devices undergoing wafer level burn in procedures, including integrated circuits, LEDs, VCSELs, and other devices.

Figure 10:
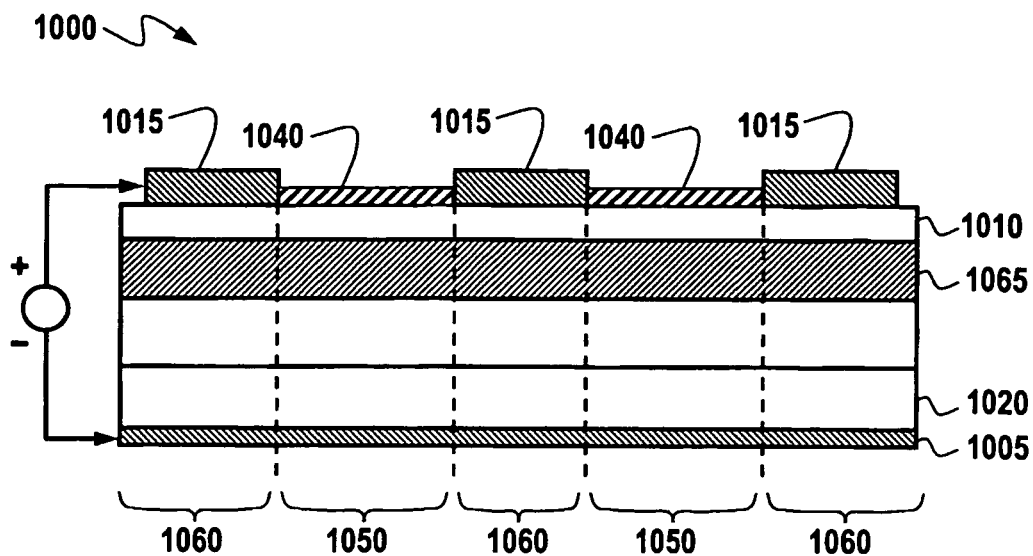
FIG. 10 illustrates diffusion patterns formed on the electronic device wafer's surface that can be used to create positive and negative polarity regions.

Referring to FIG. 10, diffusion patterns 1040 on the upper surface 1010 of the electronic device wafer 1000 can be used to create positive and negative polarity regions. As shown in FIG. 10, VCSEL devices, for example, borne by a semiconductor wafer 1000 have a substrate 1020, active component layers 1665 and upper surface layers 1010. By creating diffusion patterns 1040 on the surface of the desired polarity, the voltage potential required to flow current through undesired regions 1050, via contacts 1005 and 1015, can be increased above the voltage potential required to flow current through the desired regions 1060. In effect, the Is diffusion pattern 1040 adds a reversed biased diode in the undesired regions 1050, which adds a large voltage drop. The current will flow through the low voltage potential undiffused regions 1060 (normally including the active layer for the device) and not through the higher voltage potential diffused area 1050 (the area separating multiple devices on a wafer 1000 as shown separated by dashed lines from the active regions 1060).

This method of creating diffusion patterns is generally well known in the semiconductor industry; however, when applied as described herein to control current flow for wafer level burn-in is novel. The present diffusion patterns 1040 can be added permanently as a layer over select areas of the wafer 1000, or as a shallow diffusion layer to the surface of the wafer in select areas, e.g., as less conductive (undersired) regions 1050 such that it can subsequently be etched away by methods well known in the semiconductor field.

Figure 11:
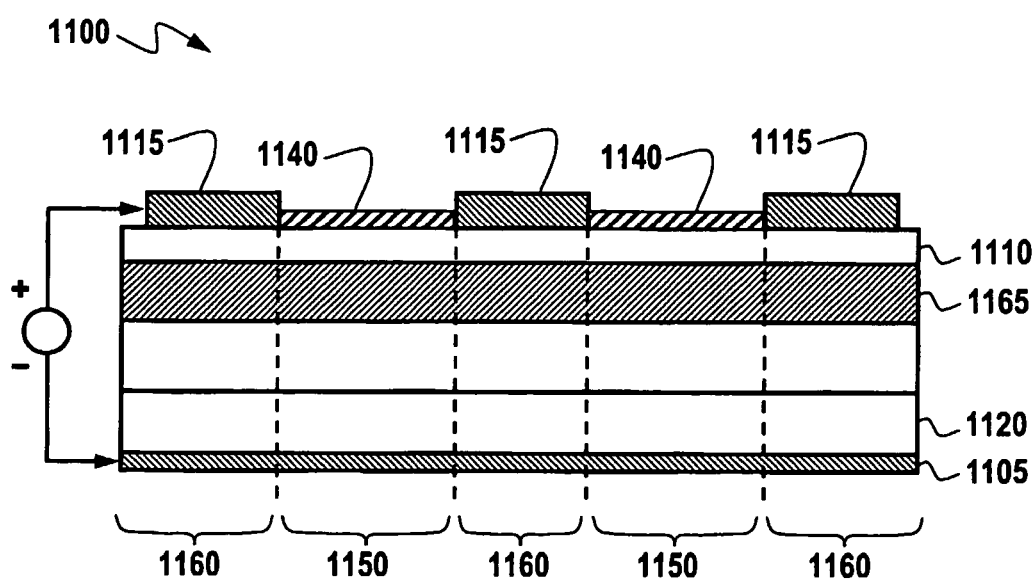
FIG. 11 illustrates metallization patterns that can also be formed at select areas on an electronic device wafer's surface.

Referring to FIG. 11, metallization patterns 1140 can also be formed at select areas (e.g., regions 1150) on an electronic device wafer's surface 1110. As with diffusion layers described above, by adding less conductive metallization patterns 1140 on the wafer's upper surface 1110, the voltage potential required to push current through undesired regions 1150 (e.g., less conductive regions) can be set higher than for desired (e.g, conductive) regions 1160. A very conductive metal pattern (e.g., contact 1115) could be added in the desired regions 1160 so that a lower resistance ohmic contact is made through the upper layer 1110, active layer 1065 and substrate 1120 primarily in areas associated with the desired regions 1160 (e.g., can also be referred to as active regions) as shown between dashed lines in the FIG. 11, unlike the insulative effect cause on these layers by placement of the high resistance non-ohmic contact 1140 associated with the undesired regions 1150. One possible application would be when both n-type and p-type contacts must be on the top surface of the wafer 1100, but it is desired that all current flow through the p-type contact during burn-in. If the p-type contact is ohmic, but the n-type contact is Schottky, current will typically flow where desired. Subsequent treatment, such as rapid thermal anneal or ion implantation, could make the n-type contact ohmic. Alternatively a high resistance non-ohmic metal pattern could be added on the upper layer 1110 in the undesired regions 1150 so that current flows through the associated regions as lower resistance non-metal pattern regions, if such region forms a lower potential-drop contact with the burn-in conductor.

Figure 12:
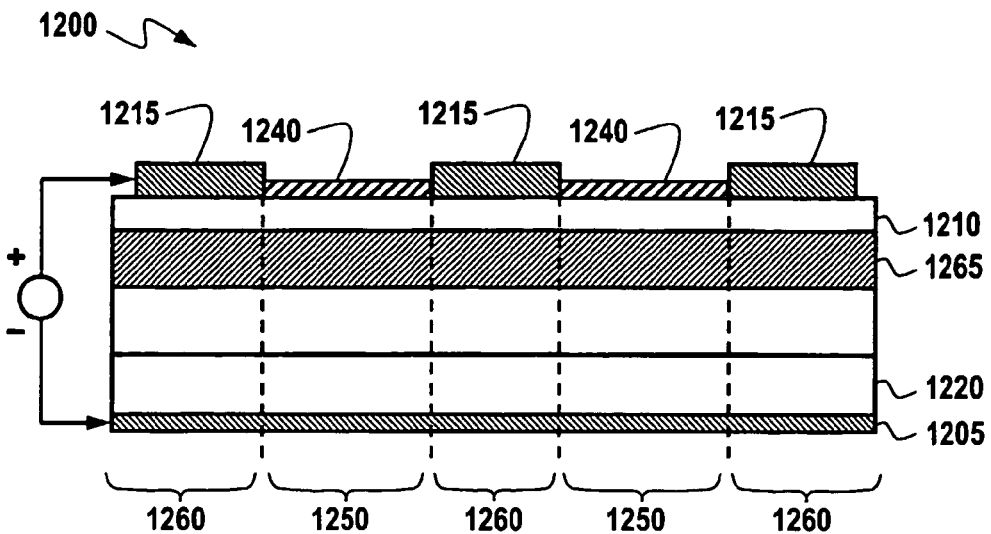
FIG. 12 illustrates implant patterns that can be added to an electronic device wafer's surface to create nonconductive regions.

Referring to FIG. 12, implant patterns 1240 can be added to an electronic device wafer's 1200 surface 1210 to create nonconductive regions 1250. Implant layers 1240 function similarly to sacrificial layers. As with diffusion layers described earlier, implantations can establish patterns of semi-insulating or isolation material on areas the upper surface 1210 associated with nonconductive regions 1250. Accordingly, vertical current flow is easily forced to flow between contact 1205 and 1215 through portions of the upper layer 1210, active layer 1265, substrate 1220, and other layers associated with the more conductive non-implanted regions 1260. Implants 1240 can be permanent, or made shallow and removed subsequently as a sacrificial layer. Optimization of an implant 1240 might allow it to be used even when photoconductivity is the dominant mechanism being used.

Figure 13:
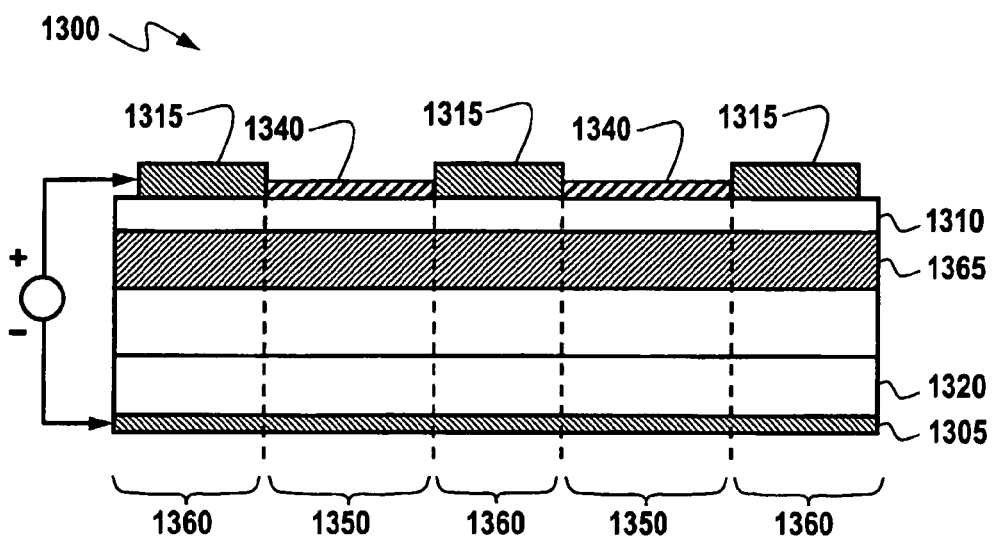
FIG. 13 illustrates dielectric patterns that can be formed on an electronic device wafer surface.

Referring to FIG. 13, dielectric patterns 1340 can be formed on the electronic device wafer 1300 upper surface 1310 in areas associated with isolated regions 1350. Dielectric materials could include, but are not limited to, nitride, oxide, polyimide, and photoresist. Silicon dioxide is a well-known semiconductor native oxide surface dielectric that is thermally grown and photolithographically patterned. Examples of deposited dielectrics that can be photolithographically patterned and selectively etched or removed that are utilized in the semiconductor industry include: silicon nitride (used frequently in VCSEL processing), silicon oxide (CVD deposition commonly utilized), polyimide (spin coat deposition), and photoresist (also spin coat deposition).

Referring again to FIG. 13, dielectric patterns 1340 can be added permanently as a layer onto the upper layer 1310, or used as sacrificial layer that is utilized during the wafer level burn-in process to control and/or direct current flow through active regions 1360 in a manner that substantially prevents flow through isolated regions 1350, then the patterns 1340 can be removed (sacrificed) after the wafer level burn-in parasitic current flow control process is completed. Furthermore, for integrated circuits, a combination of deposited dielectrics along with patterned metal can permit fabrication of a two plate wafer level burn-in method as described above (e.g., WLBI), where Vcc bias is applied to top contacts 1315 (e.g., the patterned side of the wafer) and ground bias is applied to the bottom contact 1305 (e.g., full surface metallized) side of the wafer. Accordingly, vertical current flow is more apt to flow between contact 1305 and 1315 through portions of the upper layer 1310, active layer 1365, substrate 1320, and/or any other layers associated with the more conductive active regions 1360.

Figure 14:
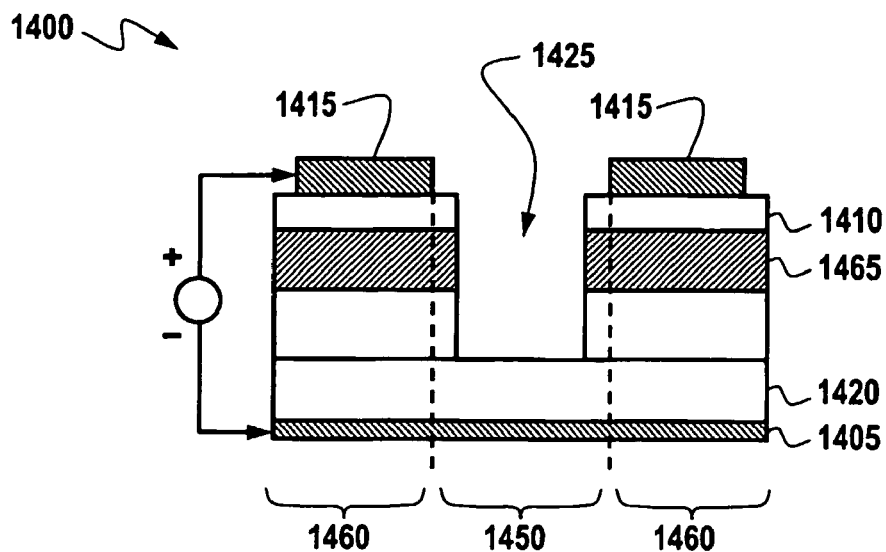
FIG. 14 illustrates trenches that can be etched, milled, or otherwise engraved into select layers and regions from a wafer's surface to control current flow between semiconductor devices borne by a wafer.

Referring to FIG. 14, trenches 1420 can be etched, milled, or otherwise engraved into select layers 1420 and regions 1450 from a wafer's 1400 upper surface 1410 to control current flow between semiconductor devices represented by active layer 1465 (e.g., a VCSEL active region) borne by the wafer 1400. Although only one trench 1420 is shown in FIG. 14, it should be understood that multiple trenches are contemplated by the present invention. By cutting, milling, etching vertical trenches 1420 into the surface 1410, and potentially other layers (e.g., active layer 1465) that lie beneath the surface 1410, current flowing between contacts 1415 and 1405 can be physically blocked from horizontal flow across trenches 1420 and can be properly focused through the active regions 1460, thereby flowing through portions of the upper layer 1410, active layer 1465, substrate 1420, and other layers associated with the more conductive active regions 1260.

Figure 15:
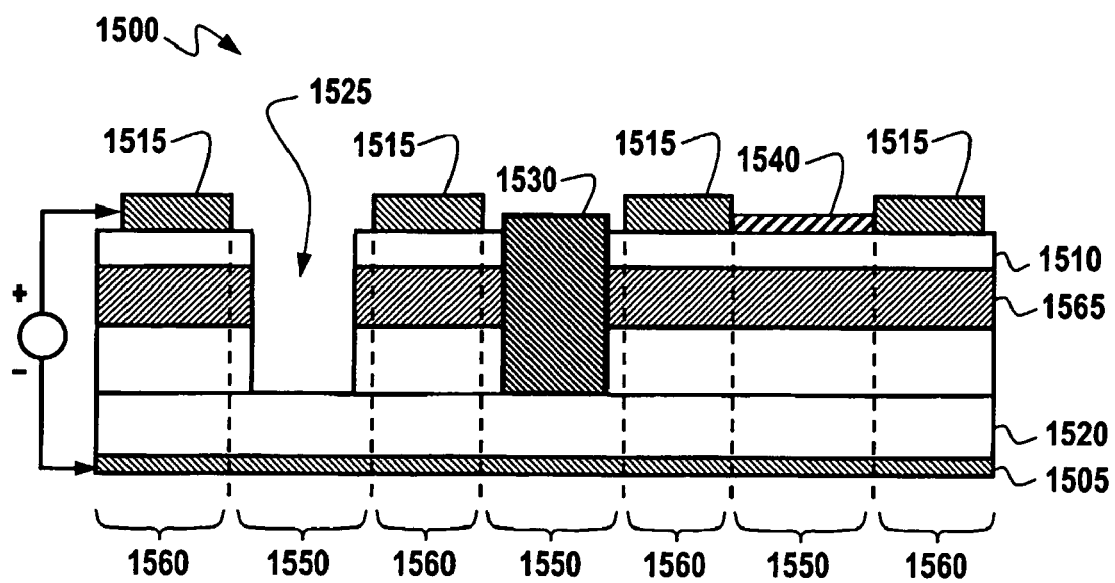
FIG. 15 illustrates oxidation patterns that can be formed vertically and/or horizontally on a wafer and can control current flow between contacts.

Referring to FIG. 15, oxidation patterns formed vertically 1530 and/or horizontally 1540 on a wafer 1500 can control current flow between contacts 1515 and 1505. Such oxidation patterns can include, but are not limited to, oxidation formed horizontally 1540 on a surface 1510 of the wafer 1500 or vertically 1530 within vertical trenches 1520. Surface nonconductive oxidation patterns that are commonly utilized in planar semiconductor technology can force vertical current flow between contacts 1505 and 1515 into active regions 1560 (e.g., associated portions of upper layer 1510, active layer 1565, substrate 1520, etc.) representing semiconductor devices borne by the wafer. Oxidation layers 1530 formed within vertical trenches 1520 can also force or otherwise direct vertical current flow into active regions 1560, thereby substantially avoiding isolated regions 1550. In III-V semiconductors, these oxides would typically be aluminum oxides; in silicon semiconductors, they would typically be $SiO_2$.

Parasitic current flow can be minimized by combining several of the above methods. For example, vertical trenches with horizontal oxidation patterns, may force current normally within the trenched area 1550, as described above, to flow instead inside the non-oxidized area active region 1565 areas. A surface dielectric layer can also be utilized to block surface contact and current flow in regions outside the non-trenched active regions 1560.

Figure 16:
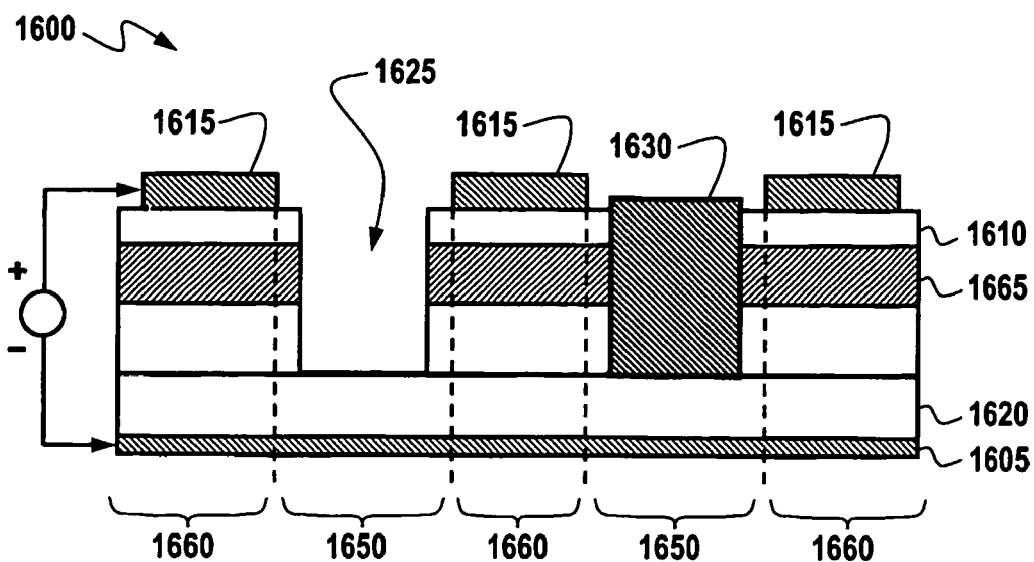
FIG. 16 illustrates trenches that can be formed in a wafer and can also is be filled with implants for minimizing electrical flow between contacts located outside of active regions.

Referring to FIG. 16, trenches 1620 formed in a wafer 1600 can also be filled with implants 1630 for minimizing electrical flow between contacts 1615 and 1605 outside of active regions 1660 (e.g., associated portions of upper layer 1510, active layer 1565, substrate 1520, etc.) representing semiconductor devices borne by the wafer. Electrical contact of surface contact material, such as graphite felt pads described with respect to FIG. 4 (i.e., pliable layer 220), about the trenched layers can be further minimized by filling vertical trench regions 1650 with the non-conductive material 1630.

Figure 17:
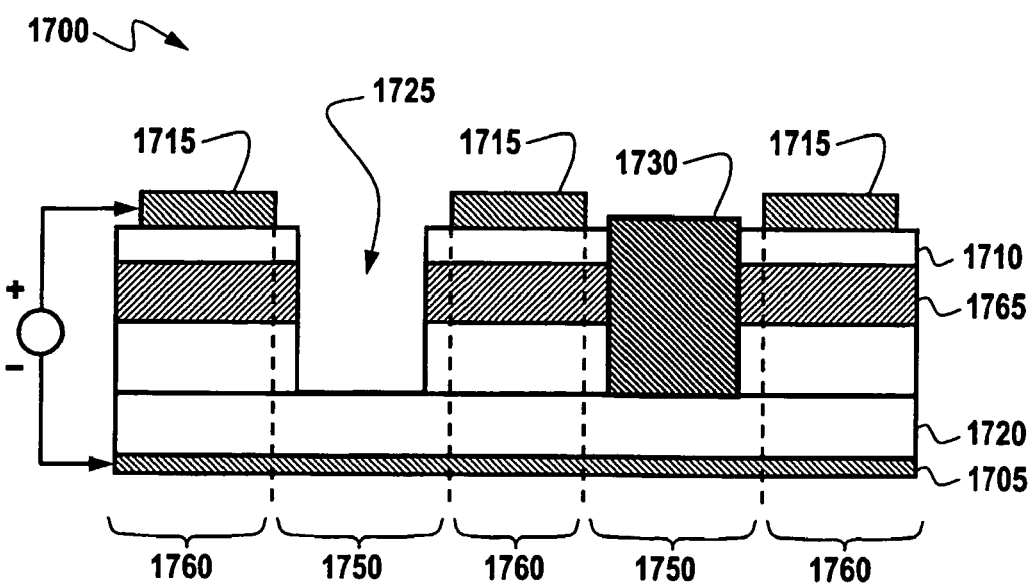
FIG. 17 illustrates trenches that can also be used for minimizing photonic flow outside of active regions of a VCSEL device.

Referring to FIG. 17, trenches 1720 defining inactive or nonconductive regions 1750 can also be used for minimizing photonic flow outside of active is regions 1760 associated with, for example, a photonic (e.g., VCSEL) device.

Furthermore, when used in the fabrication of photonic devices or arrays on a semiconductor wafer 1700, filling of vertical trenches 1720 with optical absorbing material 1730 can further prevent, minimize or reduce horizontal photon flow between active photonic devices represented by upper contacts 1715, surface layers 1710, active layers 1765, and any other layers formed above the substrate layer 1720 and common contact 1705 of the wafer 1700 within active regions 1760. Vertical trenches 1720 patterned into and from the device's surface 1710 can reduce lateral photon propagation through internal reflection (through Snell's Law of refraction) at the high/low dielectric constant interface, where the vertical trenches 1720 with air or other appropriate filler material 1730 provides a low dielectric constant (air n=1.0) interface to the high semiconductor (GaAs n=3.6). This prevents or greatly reduces lateral photon flow outside of active component layers 1765 and associated active regions 1760 separated and defined by the trenches 1720, where absorption creates photogenerated carriers and/or current flow even in isolated or semi-insulating material. Photon flow through nonconductive areas 1750 underneath the trenches would realize a negligible affect on or between active devices.

The embodiment and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention.

Many modifications and variations are possible in light of the above teaching without departing from the scope of the following claims. It is contemplated is that the use of the present invention can involve components having different characteristics. It is intended that the scope of the present invention be defined by the claims appended hereto, giving full cognizance to equivalents in all respects.

What is claimed is:

1. A method for providing photonic flow control over VCSEL devices borne by a semiconductor wafer having a substrate, at least one active component layer and a surface layer during burn-in, comprising the step of:
    forming at least one trench into said semiconductor wafer, thereby defining nonconductive regions and further defining boundaries between active component regions thereby separated by said at least one trench;
    performing a burn-in for a plurality of the devices borne in the semiconductor wafer at the same time using a first contact plate connected to a first side of the semiconductor wafer and a second contact plate connected to a second side of the semiconductor wafer, the surfaces of the first and second contact plates clamping the semiconductor wafer, wherein during the burn-in, the first and second contact plates are each provide a single common electrical contact to all devices that are borne in the semiconductor wafer and undergo the burn-in process; and
    wherein the at least one trench provides photonic flow control during the burn-in.

2. The method of claim 1, wherein said step of forming at least one trench includes the step of etching said at least one trench into said surface layer and said at least one active component layer.

3. The method of claim 1, wherein said step of forming at least one trench includes the step of milling said at least one trench into said surface layer and said at least one active component layer.

4. The method of claim 1, wherein said step of forming at least one trench includes the step of engraving said at least one trench into said surface layer and said at least one active component layer.

5. A method of claim 1, further comprising the step of: implanting isolation material into said at least one trench.

6. The method of claim 5, wherein said isolation material is an optical absorbing material.

7. A method as in claim 1, wherein a pliable conductive layer is positioned adjacent the semiconductor wafer during the burn-in process.

8. A method for providing parasitic current control over photonic devices represented by at least one active component layer borne by a semiconductor wafer, said semiconductor layer having a substrate, said at least one active component layer and at least one surface layer during burn-in, comprising the steps of:
    forming at least one trench extending from said surface layer through said at least one active component layer near said substrate, wherein said at least one trench thereby defines nonconductive regions and sets forth a nonconductive area between active component regions that operate as photonic devices on the semiconductor wafer;
    implanting photonic isolation material into said at least one trench formed between said photonic devices represented by said is active component regions, wherein said at least one trench extends from said surface layer through said at least one active component layer and
    performing a burn-in process for the photonic devices borne by the semiconductor wafer at the same time using contacts that include a pliable layer, wherein the pliable layer provides a single electrical contact to all photonic devices on the semiconductor wafer that undergo the burn-in process;
    wherein the at least one trench and the implanted photonic isolation material provide at least parasitic current control during the burn-in process.

9. The method of claim 8, wherein said isolation material is an optical absorbing material.

10. The method of claim 8, wherein said step of forming at least one trench includes the step of etching said at least one trench into said surface layer and said at least one active component layer towards said substrate.

11. The method of claim 10, wherein said isolation material is an optical absorbing material.

12. The method of claim 8, wherein said step of forming at least one trench includes the step of milling said at least one trench into said surface layer and said active component layers up to said substrate.

13. The method of claim 12, wherein said isolation material is an optical absorbing material.

14. The method of claim 8, wherein said step of forming at least one trench includes the step of engraving said at least one trench into said surface layer and said at least one active component layer.

15. The method of claim 14, wherein said isolation material is an optical absorbing material.

16. The method of claim 9, wherein said step of forming at least one trench includes the step of etching said at least one trench into said surface layer and said at least one active component layer.

17. The method of claim 9, wherein said step of forming at least one trench includes the step of milling said at least one trench into said surface layer and said at least one active component layer.

18. The method of claim 9, wherein said step of forming at least one trench includes the step of engraving said at least one trench into said surface layer and said at least one active component layer.

19. A method as in claim 8, wherein a pliable conductive layer is positioned adjacent the semiconductor wafer during the burn-in process.

* * * * *